United States Patent [19]
Melton et al.

[11] Patent Number: 5,390,080
[45] Date of Patent: Feb. 14, 1995

[54] TIN-ZINC SOLDER CONNECTION TO A PRINTED CIRCUIT BOARD OF THE LIKE

[75] Inventors: Cynthia M. Melton, Bolingbrook; Linda Weitzel, Barrington, both of Ill.

[73] Assignee: Motorola, Schaumburg, Ill.

[21] Appl. No.: 57,233

[22] Filed: May 3, 1993

[51] Int. Cl.⁶ ............................................. H05K 1/16
[52] U.S. Cl. ................................... 361/765; 361/760; 361/762; 361/792; 361/810; 174/256
[58] Field of Search ............... 361/743, 746, 760, 761, 361/762, 765, 779, 784, 792, 807, 808, 810; 174/255, 256, 261, 263; 228/901, 904, 56.3

[56] References Cited
FOREIGN PATENT DOCUMENTS 3220558  9/1988  Japan .

Primary Examiner—Leo P. Picard
Assistant Examiner—Young Whang
Attorney, Agent, or Firm—Douglas D. Fekete

[57] ABSTRACT

An electronic package comprises a component mounted on a substrate, such as a printed circuit board, by a solder connection that is based upon a tin alloy containing zinc. The connection is formed to copper faying surface on the substrate, and includes a first layer formed of a zinc-free tin metal bonded to the copper surface and a second layer formed of the tin-zinc solder alloy bonded to the first layer. The first layer provides a zinc-free barrier between the copper and the tin-zinc alloy to retard zinc migration to the copper interface that would otherwise result in dezincification of the solder alloy and reduce the mechanical properties of the connection.

8 Claims, 1 Drawing Sheet

TIN-ZINC SOLDER CONNECTION TO A PRINTED CIRCUIT BOARD OF THE LIKE

BACKGROUND OF THE INVENTION

This invention relates to connecting an electronic component to a copper pad on a printed circuit board or the like utilizing a tin-zinc solder alloy. More particularly, this invention relates to forming such tin-zinc solder connection wherein the copper pad is first coated with a zinc-free tin layer that forms a barrier between the zinc alloy and the copper to prevent dezincification during use that would otherwise compromise the mechanical integrity of the connection.

In the manufacture of a microelectronic package, it is common practice to mount an electronic component onto a printed circuit board or the like utilizing a solder connection that not only physically attaches the component to the board, but also electrically connects the component to a circuit trace on the board for conducting electrical signals to or from the component for processing. The circuit trace is formed of copper to provide high electrical conductivity. The circuit trace includes a bond pad that constitutes a first faying surface for the connection. The component includes a contact or other feature that constitutes the other faying surface. One method for forming the solder connection utilizes a solder paste. A typical paste contains particles of solder alloy dispersed in a vaporizable vehicle that includes flux and an expendable organic binder. The deposit of the paste is applied to the bond pad, after which the component is assembled with the second faying surface in contact with the deposit. The assembly is then heated to melt and reflow the solder alloy. Upon cooling, the solder alloy resolidifies and bonds to the faying surfaces to complete the connection.

In the past, most common solders were based upon tin-lead alloy. Tin and lead form a eutectic composition having a melting temperature of about 183° C., which is suitably low to permit reflow while avoiding thermal damage to the component or other features typically formed on the printed circuit board, but is sufficiently high to withstand temperature excursions of the type experienced by the package during normal operations. However, it is desired to reduce the lead content in electronic packages by forming solder connections of alloys that are essentially free of lead.

It has been proposed to form solder connections to faying surfaces that are aluminum using a tin-zinc solder alloy. However, zinc alloy in the presence of copper undergoes dezincification, a phenomenon by which zinc migrates to the copper interface, leaving voids in the solder that reduce the mechanical integrity of the connection. Also, copper that may dissolve into the solder during reflow may form a galvanic coupling with the zinc and accelerate corrosion of the connection. Difficulty is encountered in reflowing the tin-zinc alloy to wet the copper surface, which wetting is essential to forming a strong solder bond. Thus, zinc solder alloys have not heretofore been utilized in forming solder connections to copper pads on printed circuit boards.

SUMMARY OF THE INVENTION

This invention contemplates an electronic package wherein an electronic component is mounted onto a substrate, such as a printed circuit board, by a connection that is based upon a lead-free tin-zinc solder alloy. The substrate includes a copper pad that constitutes a first faying surface for the connection, whereas the component includes a contact or similar feature that constitutes the second faying surface. In accordance with this invention, the connection includes a first layer immediately bonded to the copper pad and formed of a zinc-free tin-base metal having a melting temperature greater than the reflow temperature of the tin-zinc solder alloy. The solder connection further comprises a second layer composed of a tin-zinc alloy and fused to the first layer, which second layer is also bonded to the contact of the component to complete the connection. The first, tin-base layer provides a zinc-free barrier that separates the zinc-containing solder from the copper pad to inhibit dezincification that would otherwise compromise the integrity of the connection, as well as to reduce dissolution of copper into the tin-zinc solder alloy that would otherwise accelerate corrosion.

In one aspect of this invention, a method for mounting a component onto the substrate utilizes tin-zinc solder alloy applied as a paste. The method comprises coating the copper faying surface with a first layer composed of a zinc-free tin-base metal, applying a solder paste containing tin-zinc solder alloy particles to the first layer, and thereafter heating to reflow the tin-zinc alloy to the tin-base layer. Upon cooling, the tin-zinc alloy resolidifies and solder bonds to the first layer and to the second faying surface to complete the connection.

BRIEF DESCRIPTION OF THE DRAWINGS

The present invention will be further illustrated with reference to the accompanying drawings wherein.

DETAILED DESCRIPTION OF THE INVENTION

Figure 1:
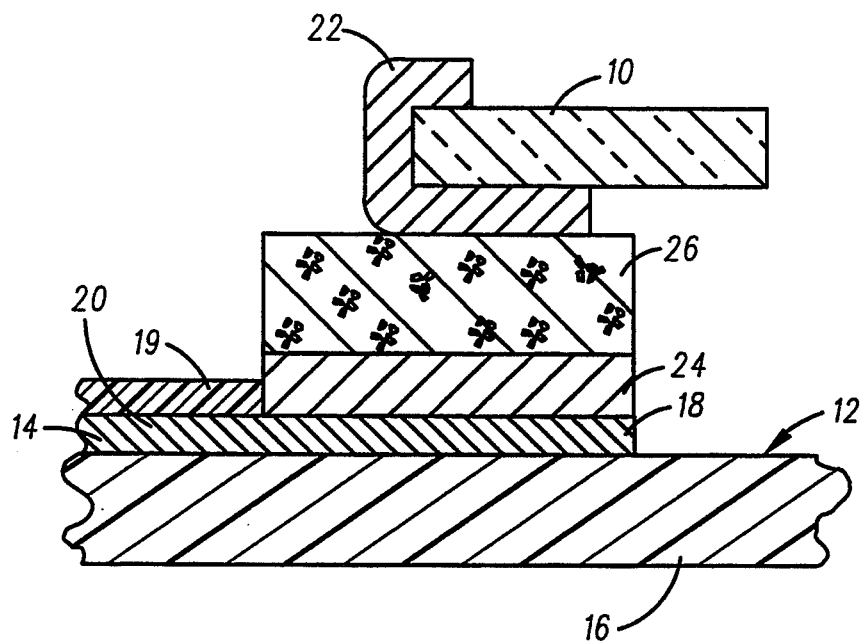
FIG. 1 is a cross-sectional view of an assembly of an electronic component and a printed circuit board in preparation for forming a solder connection in accordance with this invention.
Figure 2:
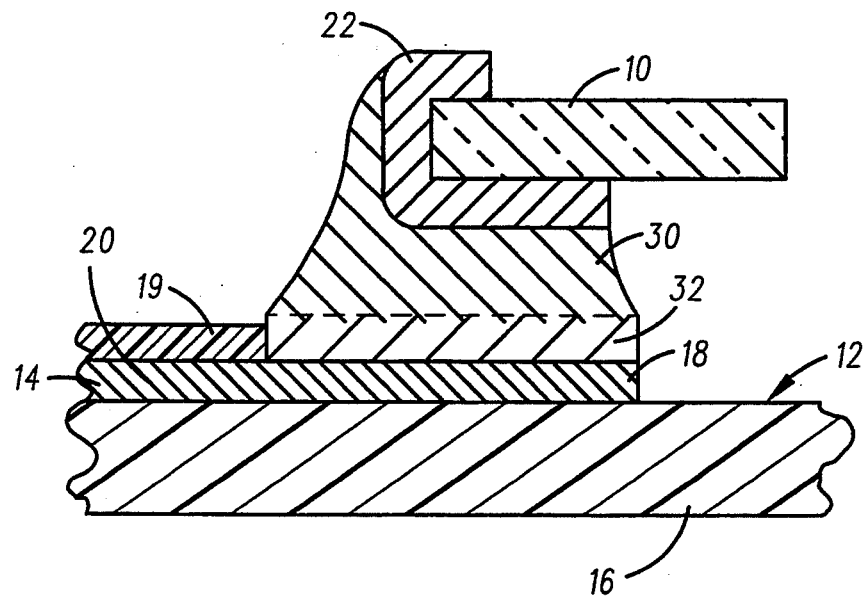
FIG. 2 is cross-sectional view of the assembly in FIG. 1 following solder reflow to connect the component to the printed circuit board.

In a preferred embodiment, referring to FIGS. 1-2, this invention is employed to attach a discrete component 10, such as a resistor or the like, to a printed circuit board 12. Printed circuit board 12 comprises a metallic copper trace 14 affixed to the dielectric substrate 16 of the type referred to as an FR4 card and composed of an epoxy resin and glass fiber laminate. Trace 14 includes a surface mount pad 18 that is adapted for attaching component 10 and an adjacent runner section 20 for electrically connecting pad 18 to remote sections of trace 14. In this description, pad 18 constitutes a first faying surface for forming the connection. Component 10 comprises a land 22 formed of palladium-silver alloy, which constitutes a second faying surface for the connection. Land 22 may include a thin tin flash to enhance wetting during solder reflow.

In accordance with this invention, a first layer 24 is initially applied to pad 18 and is formed of a tin-base metal, which in a preferred embodiment is a tin-silver solder alloy. Prior to forming layer 24, a solder-nonwettable polymeric layer 19, referred to as a solder stop, is applied to runner section 20 to confine the solder to pad 18. Pad 18 is cleaned using a dilute aqueous phosphoric acid solution. A solder paste containing tin-silver alloy powder dispersed in a vaporizable vehicle is screen printed onto pad 18 to form a deposit. A preferred powder is composed of a solder alloy containing 3.5 weight percent silver and the balance substantially tin and having a melting temperature of about 221° C. The preferred alloy is essentially free of zinc and lead. The powder is sized to between −200 and +325 mesh. A suitable vehicle is a solvent composed of high boiling alcohols and glycol and containing a white rosin flux and an expendable organic binder, suitably ethyl cellulose compound. The paste deposit is applied by screen printing and is heated to a temperature of about 240° C. to vaporize the vehicle including the binder and to melt the solder to form a liquid phase that spreads onto and wets the copper surface of the pad. It is pointed out that the reflow temperature is significantly above the melting point of the tin-silver solder to accelerate melting of the alloy and thereby minimize the time during which the board is exposed to the elevated temperature to complete reflow. Upon cooling, the liquid solidifies to form a layer 24 having a thickness of at least about 25 microns, and preferably between about 50 and 200 microns. Layer 24 is composed substantially of tin and silver, but may contain a minor mount of copper that dissolves into the solder liquid during reflow.

In preparation for completing the connection, a deposit 26 in FIG. 1 of solder paste is applied to tin-base layer 24. In a preferred embodiment, the paste contains solder powder composed of 9.0 weight percent zinc and the balance tin and having a melting temperature of about 199° C. The powder is sized to between −200 and +325 mesh. The fin-zinc powder is dispersed in a solvent composed of high boiling alcohols and glycol and containing a flux, suitably white rosin compound. The paste also includes an expendable organic binder, suitably ethyl cellulose compound. The paste is applied conveniently by screen printing and dried to produce deposit 26, in which the tin-zinc particles are bonded by the organic binder. In this embodiment, sufficient paste is applied to form a deposit having a thickness of at least 80 microns, and preferably between about 100 and 150 microns.

Following application of deposit 26, component 10 is assembled with faying surface 22 in contact with deposit 26, as depicted in FIG. 1. To complete the connection, the assembly is heated to a maximum temperature of about 220° C. to reflow the solder alloy. During the initial stages of heating, the organic binder and residual solvent are vaporized. As the assembly is heated above the melting point of the tin-zinc alloy, the solder particles melt and coalesce to produce a liquid phase that wets layer 24 and contact 22. Liquification of the particulate layer is accompanied by shrinkage of the apparent volume of the solder and slight collapse of the component toward the pad. As with the reflow of the tin-silver alloy, the solder paste is heated significantly above the melting point of the solder particles to accelerate melting and reduce cycle time. However, it is a significant feature of this embodiment that the reflow temperature is less than the melting temperature of the tin-silver alloy to prevent reflow of the first layer. As a result, the first layer remains solid to prevent contact between the copper pad and the tin-zinc liquid. Concurrently, the tin-zinc liquid wets contact 22 in the manner required for forming a strong solder bond. The assembly is then cooled to solidify the fin-zinc alloy and form a second layer 30 in FIG. 2 that bonds to first layer 24 and to contact 22 and extends continuously therebetween to complete the connection that both physically and electrically joins component 10 and board 12. At the interface between layer 24 and layer 30, the metal fuses to produce a strong metallurgical bond. However, regions proximate to the copper pad remain solid and produce a zinc-free barrier between the tin-zinc layer and the copper pad.

Therefore, this invention provides a solder connection to a copper faying surface that is formed by reflowing a tin-zinc solder alloy and further that includes a zinc-free metallic tin layer that separates the zinc alloy from the copper. While not limited to any particular theory, it is believed that, in a system that features tin-zinc alloy in immediate contact with copper, zinc tends to migrate to the copper interface over extended time, leaving voids in the microstructure of the connection. The migration of zinc from regions remote from the interface is facilitated by voids vacated by the zinc adjacent to the interface. In accordance with this invention, the first layer provides a zinc-free barrier between the copper and the zinc alloy that does not contain voids and blocks zinc migration. As a result, the zinc-free tin layer retards dezincification of the tin-zinc second layer that would otherwise degrade the mechanical strength of the connection, thereby extending the life of the package.

Accordingly, the first layer in the connection is formed of metal that is predominantly tin. As used herein, tin-base metal refers to metal that is more than 50 percent tin. Preferably, the first layer is composed of at least 90 weight percent tin. Commercial grade tin alloys are available that contain less than 0.1 weight percent zinc, so as to be essentially zinc free. Also, preferably, the tin layer contains minor amounts of alloying agents, such as silver in the described embodiment, to reduce the melting point and improve mechanical properties and is also essentially free of lead. The tin-silver alloy in the described embodiment is a conventional solder alloy that is commercially available in paste and is readily reflowed onto copper, thereby permitting a strong solder bond at the copper faying surface. Alternately, the first layer may be applied by electroplating tin or tin alloy onto the copper, or by any suitable process for coating metal onto a substrate, such as sputtering or vapor deposition.

The solder connection of this invention also includes a second layer that is formed of a tin alloy containing zinc. Tin and zinc form a low melting eutectic composition containing about 9 weight percent zinc and the balance tin and having a melting temperature of about 199° C. It is a significant feature of the preferred embodiment that the connection is completed without melting the first layer that lies immediately adjacent the copper, thereby preventing the first layer from mixing with the tin-zinc alloy to form a uniform zinc-containing composition. In general, as with the reflow of eutectic tin-lead solder, it is desired to complete the connection by reflowing within a temperature range suitable low to prevent damage to the other feature of the assembly. Alloys containing between about 4 and 12 weight percent zinc have liquidus temperature less than about 220° C., suitably low for reflow onto epoxy-base printed circuit boards. Hypereutectic alloys, i.e., alloys having a zinc content greater than the eutectic, are preferred to promote liquification while avoiding premature solidification due to tin dissolution at the interface with the tin-rich first layer. Accordingly, tin alloys containing between about 9 and 11 weight percent zinc are preferred.

It is pointed out that the melting of tin solder adjacent to copper is typically accompanied by some dissolution of copper into the tin liquid. Thus, in the described embodiment, copper may dissolve during the reflow of the tin-base metal in forming the first layer. However, it is a further feature of the preferred embodiment of this invention that the first layer remains solid during solder reflow of the second layer, thereby minimizing dissolution of copper into the tin-zinc alloy that would otherwise tend to accelerate corrosion of the connection. In the described embodiment, this invention is employed for mounting a discrete component to an epoxy-glass board. This invention may be adapted or forming solder connections to substrates formed of other materials, such a ceramic, and having faying surfaces based upon metallic copper. Also, in an alternate embodiment, this invention may be employed in forming a solder bump interconnection, for example, in attaching an integrated circuit die to a substrate that may be a chip carrier or a printed circuit board. For this purpose, the substrate includes a copper terminal that constitutes the first laying surface for the connection and, in accordance with this invention, is initially coated with a first layer formed of a zinc-free tin-base alloy. The terminal disposed on a face of the integrated circuit die constitutes the second laying surface for the connection. A solder bump composed of tin-zinc solder alloy is affixed to the terminal, for example, by reflowing the alloy onto the terminal. The integrated circuit die is then arranged so that the solder bump rests against the first layer. The assembly is heated and cooled to reflow the solder bump without reflowing the first layer and thereby bond the bump to the first layer to complete the connection. Similarly, a chip carrier having an integrated circuit die may be attached to a printed circuit board by a tin-zinc solder bump connection.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. An electronic package comprising
   a substrate comprising a first faying surface formed of copper metal,
   a component comprising a second faying surface, and
   a solder connection bonding the first faying surface and the second faying surface, said solder connection comprising a first layer formed of a substantially zinc-free tin-base metal and bonded to the first faying surface and a second layer formed of a tin alloy containing zinc and fused to the first layer.

2. An electronic package in accordance with claim 1 wherein the tin-base metal contains at least about 90 weight percent tin.

3. An electronic package in accordance with claim 1 wherein the tin alloy contains between about 4 and 12 weight percent zinc.

4. An electronic package comprising
   a printed circuit board comprising a bond pad formed of copper metal,
   an electronic component having a contact formed of a solder-wettable metal, and
   a solder connection bonding the bond pad and the contact, said solder connection comprising a first layer bonded to the bond pad and formed of a substantially zinc-free solder composed of at least 90 weight percent tin and having first melting temperature, said solder connection comprising a second layer formed of a solder alloy comprising between about 4 and 12 weight percent zinc and the balance substantially tin and having a melting temperature less than the first melting temperature, said second layer being fused to the first layer and bonded to the contact to complete the connection.

5. An electronic package in accordance with claim 4 wherein the first melting temperature is at least 220° C. and the second melting temperature is less than 220° C.

6. An electronic package in accordance with claim 4 wherein the second layer is formed of a solder alloy containing between about 9 and 11 weight percent zinc.

7. An electronic package in accordance with claim 4 wherein the first layer has a thickness of at least about 25 microns.

8. An electronic package in accordance with claim 4 where the first layer has a thickness between about 50 and 100 microns.

* * * * *